United States Patent
Camacho et al.

(10) Patent No.: US 8,766,428 B2
(45) Date of Patent: Jul. 1, 2014

(54) INTEGRATED CIRCUIT PACKAGING SYSTEM WITH FLIP CHIP AND METHOD OF MANUFACTURE THEREOF

(75) Inventors: Zigmund Ramirez Camacho, Singapore (SG); Henry Descalzo Bathan, Singapore (SG); Jairus Legaspi Pisigan, Singapore (SG)

(73) Assignee: Stats Chippac Ltd., Singapore (SG)

( * ) Notice: Subject to any disclaimer, the term of this patent is extended or adjusted under 35 U.S.C. 154(b) by 521 days.

(21) Appl. No.: 12/629,879

(22) Filed: Dec. 2, 2009

(65) Prior Publication Data
US 2011/0127661 A1   Jun. 2, 2011

(51) Int. Cl.
H01L 23/52 (2006.01)
H01L 23/06 (2006.01)
H01L 23/02 (2006.01)
H01L 23/22 (2006.01)
H01L 23/24 (2006.01)

(52) U.S. Cl.
USPC ........... 257/692; 257/684; 257/686; 257/687; 257/E23.061; 257/E21.499; 438/25; 438/51; 438/55; 438/64

(58) Field of Classification Search
USPC ............ 257/678–733; 438/25, 26, 51, 55, 64, 438/106–127
See application file for complete search history.

(56) References Cited

U.S. PATENT DOCUMENTS

| | | | | |
|---|---|---|---|---|
| 5,157,475 A * | 10/1992 | Yamaguchi | | 257/784 |
| 6,239,366 B1 | 5/2001 | Hsuan et al. | | |
| 6,339,255 B1 * | 1/2002 | Shin | | 257/686 |
| 6,590,281 B2 * | 7/2003 | Wu et al. | | 257/684 |
| 6,846,704 B2 * | 1/2005 | Paek | | 438/123 |
| 7,115,445 B2 * | 10/2006 | Lee et al. | | 438/123 |
| 7,291,924 B2 | 11/2007 | Wang et al. | | |
| 7,381,588 B1 * | 6/2008 | Patel et al. | | 438/109 |
| 7,411,289 B1 * | 8/2008 | McLellan et al. | | 257/700 |
| 7,622,333 B2 | 11/2009 | Kim et al. | | |
| 2002/0167079 A1 * | 11/2002 | Pu et al. | | 257/685 |
| 2004/0089926 A1 * | 5/2004 | Hsu et al. | | 257/678 |
| 2006/0027902 A1 * | 2/2006 | Ararao et al. | | 257/676 |
| 2007/0166879 A1 * | 7/2007 | Fang | | 438/106 |
| 2007/0278643 A1 | 12/2007 | Yee | | |
| 2008/0029866 A1 * | 2/2008 | Kim et al. | | 257/686 |
| 2008/0029868 A1 | 2/2008 | Lee et al. | | |
| 2008/0284002 A1 * | 11/2008 | Camacho et al. | | 257/723 |
| 2009/0250807 A1 * | 10/2009 | Lim et al. | | 257/712 |

OTHER PUBLICATIONS

U.S. Appl. No. 12/488,557, filed Jun. 20, 2009, Bathan et al.

* cited by examiner

Primary Examiner — Karen Kusumakar
(74) Attorney, Agent, or Firm — Ishimaru & Associates LLP

(57) ABSTRACT

A method of manufacture of an integrated circuit packaging system includes: forming external interconnects having bases of a first thickness and tips of a second thickness extending inwardly directly toward each other; connecting a first circuit device between the tips; attaching a second circuit device to the first circuit device with a combined thickness of the first circuit device and the second circuit device less than the first thickness; and forming an encapsulation of the first thickness between the bases and over the tips.

20 Claims, 7 Drawing Sheets

INTEGRATED CIRCUIT PACKAGING SYSTEM WITH FLIP CHIP AND METHOD OF MANUFACTURE THEREOF

TECHNICAL FIELD

The present invention relates generally to an integrated circuit packaging system, and more particularly to a system for an integrated circuit packaging system with a flip chip.

BACKGROUND ART

Increased miniaturization of components, greater packaging density of integrated circuits ("ICs"), higher performance, and lower cost are ongoing goals of the computer industry. Semiconductor package structures continue to advance toward miniaturization, to increase the density of the components that are packaged therein while decreasing the sizes of the products that are made using the semiconductor package structures. This is in response to continually increasing demands on information and communication products for ever-reduced sizes, thicknesses, and costs, along with ever-increasing performance.

These increasing requirements for miniaturization are particularly noteworthy, for example, in portable information and communication devices such as cellular phones, hands-free cellular phone headsets, personal data assistants ("PDA's"), camcorders, notebook computers, and so forth. All of these devices continue to be made smaller and thinner to improve their portability. Accordingly, large-scale IC ("LSI") packages that are incorporated into these devices are required to be made smaller and thinner. The package configurations that house and protect LSI require them to be made smaller and thinner as well.

Many conventional semiconductor (or "chip") packages are of the type where a semiconductor die is molded into a package with a resin, such as an epoxy molding compound. Numerous package approaches stack multiple integrated circuit dice or package in package (PIP) or a combination. Other approaches include package level stacking or package-on-package (POP). POP designs face reliability challenges and higher cost.

Thus, a need still remains for an integrated circuit packaging system providing low cost manufacturing, improved yield, low profile, and improved reliability. In view of the ever-increasing need to save costs and improve efficiencies, it is more and more critical that answers be found to these problems.

Solutions to these problems have been long sought but prior developments have not taught or suggested any solutions and, thus, solutions to these problems have long eluded those skilled in the art.

DISCLOSURE OF THE INVENTION

The present invention provides a method of manufacture of an integrated circuit packaging system including: forming external interconnects having bases of a first thickness and tips of a second thickness extending inwardly directly toward each other; connecting a first circuit device between the tips; attaching a second circuit device to the first circuit device with a combined thickness of the first circuit device and the second circuit device less than the first thickness; and forming an encapsulation of the first thickness between the bases and over the tips.

The present invention provides an integrated circuit packaging system including: external interconnects having bases of a first thickness and tips of a second thickness extending inwardly directly toward each other; a first circuit device connected between the tips; a second circuit device attached to the first circuit device with a combined thickness of the first circuit device and the second circuit device less than the first thickness; and an encapsulation of the first thickness between the bases and over the tips.

Certain embodiments of the invention have other steps or elements in addition to or in place of those mentioned above. The steps or element will become apparent to those skilled in the art from a reading of the following detailed description when taken with reference to the accompanying drawings.

BEST MODE FOR CARRYING OUT THE INVENTION

Figure 1:
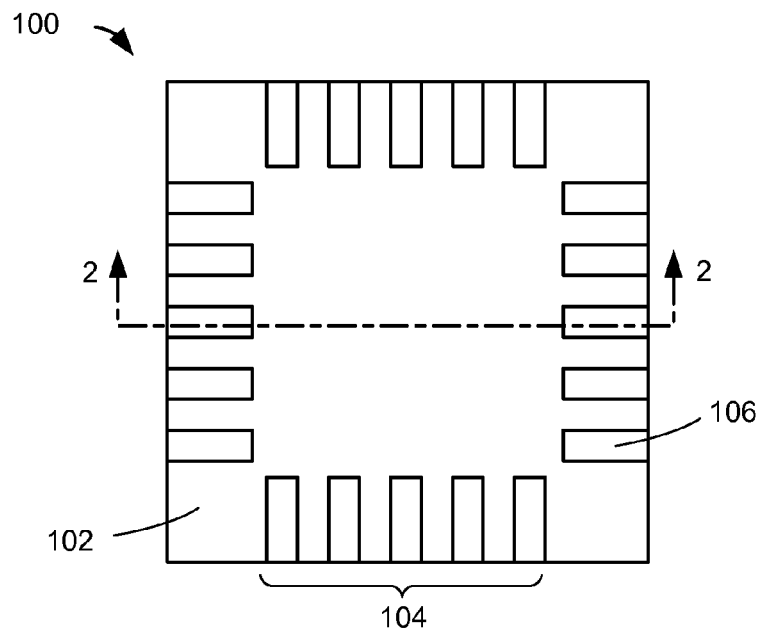
FIG. 1 is a top view of an integrated circuit packaging system in a first embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail. Likewise, the drawings showing embodiments of the system are semi-diagrammatic and not to scale and, particularly, some of the dimensions are for the clarity of presentation and are shown greatly exaggerated in the drawing FIGs. Generally, the invention can be operated in any orientation.

In addition, where multiple embodiments are disclosed and described having some features in common, for clarity and ease of illustration, description, and comprehension thereof, similar and like features one to another will ordinarily be described with like reference numerals. The embodiments have been numbered first embodiment, second embodiment, etc. as a matter of descriptive convenience and are not intended to have any other significance or provide limitations for the present invention.

For expository purposes, the term "horizontal" as used herein is defined as a plane parallel to the plane or surface of the integrated circuit, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane.

The term "on" means there is direct contact between elements. The term "processing" as used herein includes deposition of material, patterning, exposure, development, etching, cleaning, molding, and/or removal of the material or as required in forming a described structure.

Referring now to FIG. 1, therein is shown a top view of an integrated circuit packaging system 100 in a first embodiment of the present invention. The top view depicts an encapsulation 102, such as a cover including an epoxy molding compound. A row 104 of external interconnects 106, such as leads, can be exposed from the encapsulation 102. The row 104 of the external interconnects 106 can be along a side of the encapsulation 102. The external interconnects 106 can be made from a copper, nickel/palladium, or gold alloy.

For illustrative purposes, the integrated circuit packaging system 100 is shown with the row 104 of the external interconnects 106 along four sides of the encapsulation 102 although it is understood that the row 104 of the external interconnects 106 can have a different configuration. For example, the row 104 of the external interconnects 106 can be along one or more sides of the encapsulation 102.

Figure 2:
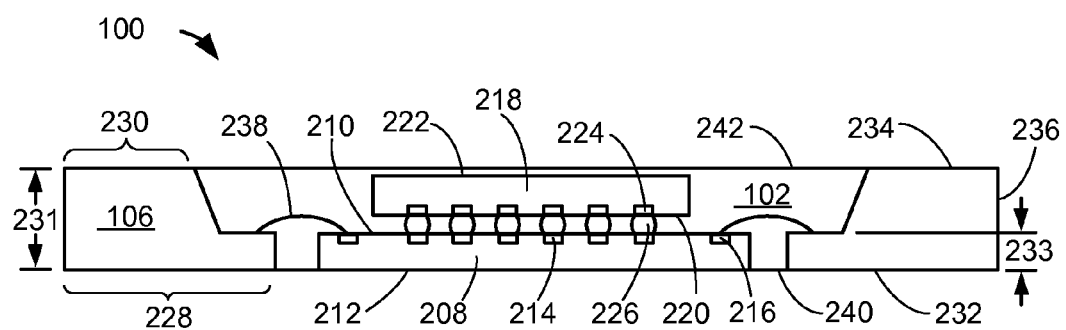
FIG. 2 is a cross-sectional view of the integrated circuit packaging system along line segment 2-2 of FIG. 1.

Referring now to FIG. 2, therein is shown a cross-sectional view of the integrated circuit packaging system 100 along line 2-2 of FIG. 1. The cross-sectional view depicts a first circuit device 208, such as an integrated circuit die, a thin or ultra thin integrated circuit die, a through silicon via (TSV) device, or a wiring substrate. The first circuit device 208 can have a first circuit device active side 210 and a first circuit device non-active side 212. The first circuit device 208 can have active circuitry (not shown) fabricated along the first circuit device active side 210. Mounting pads 214, such as bond pads for connecting devices to the first circuit device 208, can be along the first circuit device active side 210. The first circuit device 208 has the first circuit device active side 210 with the mounting pads 214 therein. Interconnect pads 216, such as bond pads, can be along and adjacent to the periphery of the first circuit device active side 210.

The integrated circuit packaging system 100 can include a second circuit device 218, such as an integrated circuit die, a thin or ultra thin integrated circuit die, a flip chip, a through silicon via (TSV) device, or a wiring substrate. The second circuit device 218 can have a second circuit device active side 220 and a second circuit device non-active side 222. The second circuit device active side 220 can have active circuitry (not shown) fabricated thereto. Contact pads 224, such as bond pads, can be along the second circuit device active side 220. The second circuit device 218 has the second circuit device active side 220 with the contact pads 224 therein.

The second circuit device 218 can be attached to the first circuit device 208 in an active side to active side configuration with the second circuit device active side 220 faces the first circuit device active side 210. The contact pads 224 along the second circuit device active side 220 can be vertically aligned with the mounting pads 214 along the first circuit device active side 210.

Device interconnects 226, such as solder balls, solder bumps, or conductive bumps, are directly connected to the contact pads 224 and the mounting pads 214. The device interconnects 226 can provide redistribution through the first circuit device 208 to the second circuit device 218. The first circuit device 208 can be larger than the second circuit device 218 with the horizontal dimension of the first circuit device 208 greater than the horizontal dimension of the second circuit device 218. For example, the edges of the first circuit device 208 can extend beyond the edges of the second circuit device 218.

The external interconnects 106 can have an L-shape configurations with tips 228 integrally formed with bases 230. The tips 228 are the horizontal portion of the letter "L" and the bases 230 are the vertical portion of the letter "L." The bases 230 can have a first thickness 231. The combined thickness of the first circuit device 208 and the second circuit device 218 can be less than the first thickness 231.

The tips 228 of the L-shape configurations can extend inwardly directly toward each other. In addition, the tips 228 can be being coplanar with each other. The tips 228 can have a second thickness 233.

The external interconnects 106 can have an external interconnect first side 232, an external interconnect second side 234, and an external interconnect vertical side 236. The external interconnect first side 232, the external interconnect second side 234, and the external interconnect vertical side 236 can be exposed to ambient.

Internal interconnects 238, such as bond wires, ribbon bond wires, can connect the tips 228 of the external interconnects 106 and the interconnect pads 216 of the first circuit device 208. The first circuit device 208 can be adjacent to and between the tips 228 of the external interconnects 106 at horizontally opposing sides of the first circuit device 208.

The encapsulation 102 can partially cover the external interconnects 106 and the first circuit device 208. The encapsulation 102 can cover the internal interconnects 238 the device interconnects 226 and the second circuit device 218.

The encapsulation 102 can be of the first thickness 231, between the bases 230 and over the tips 228. The tips 228 of the external interconnects 106 can be exposed from an encapsulation first side 240 along the external interconnect first side 232. The external interconnect first side 232 can be coplanar with the encapsulation first side 240.

The bases 230 of the external interconnects 106 can be exposed from an encapsulation second side 242 along the external interconnect second side 234. The external interconnect second side 234 can be coplanar with the encapsulation second side 242.

The first circuit device non-active side 212 can be exposed from the encapsulation first side 240. The first circuit device non-active side 212 can be exposed to ambient and may be used as a thermal dissipation surface. The first circuit device non-active side 212 can be coplanar with the encapsulation first side 240 and the external interconnect first side 232.

For illustrative purposes, the integrated circuit packaging system 100 is shown with the encapsulation 102 covering the second circuit device non-active side 222, although it is understood that the encapsulation 102 can have a different configuration with the second circuit device 218. For example, the second circuit device non-active side 222 can be exposed along and be coplanar with the encapsulation first side 240.

It has been discovered that the present invention provides the integrated circuit packaging system 100 having a lower package profile, increased component connectivity and a simplified packaging structure. The aligned connection between the device and integrated circuit provide increased inter-component connectivity and eliminates the need for additional connectivity between the device and the external interconnects. The elimination of the additional connectivity simplifies the packaging structure and allows manufacture of packages having a lower profile.

Figure 3:
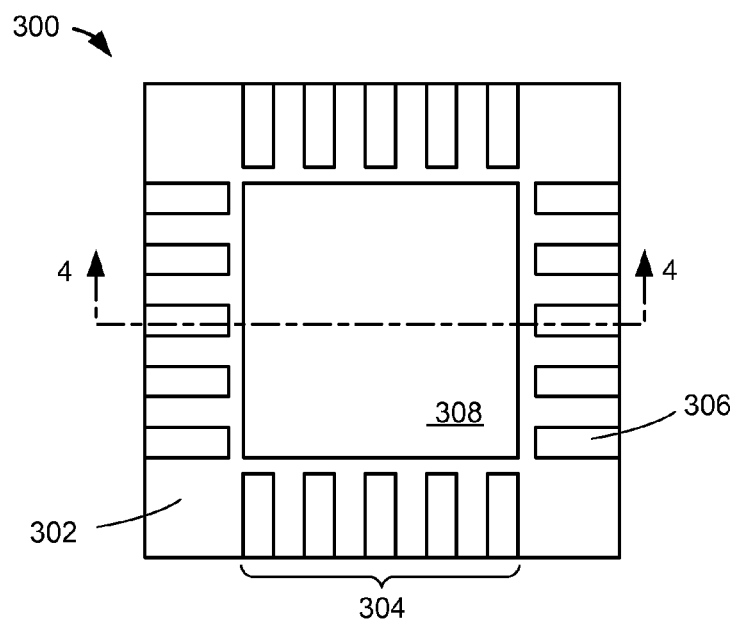
FIG. 3 is a top view of an integrated circuit packaging system in a second embodiment of the present invention.

Referring now to FIG. 3, therein is shown a top view of an integrated circuit packaging system 300 in a second embodiment of the present invention. The top view depicts an encapsulation 302, such as a cover including an epoxy molding compound. A first circuit device 308, such as an integrated circuit die, a thin or ultra thin integrated circuit die, a flip chip, a through silicon via (TSV) device, or a wiring substrate, can be exposed from the encapsulation 302. A row 304 of external interconnects 306, such as leads can be exposed from the encapsulation 302. The row 304 of the external interconnects 306 can be along a side of the encapsulation 302. The external interconnects 306 can be made from a conductive material such as copper, nickel/palladium, or gold alloy.

For illustrative purposes, the integrated circuit packaging system 300 is shown with the row 304 of the external interconnects 306 along four sides of the encapsulation 302 although it is understood that the row 304 of the external interconnects 306 can have a different configuration. For example, the row 304 of the external interconnects 306 can be along one or more sides of the encapsulation 302.

Figure 4:
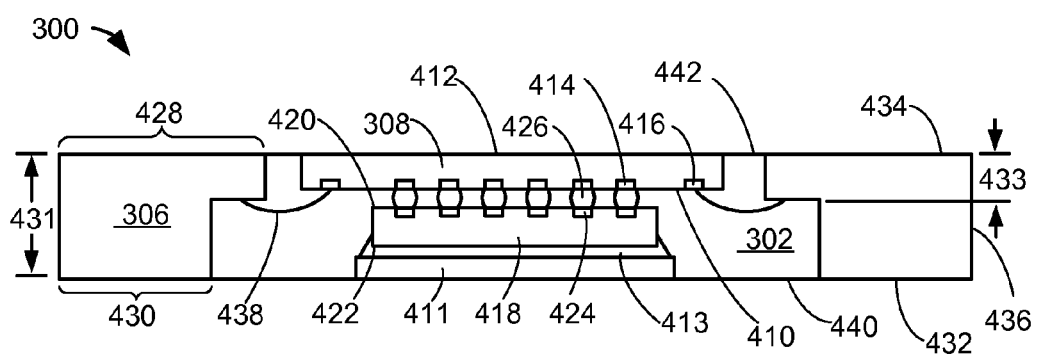
FIG. 4 is a cross-sectional view of the integrated circuit packaging system along line segment 4-4 of FIG. 3.

Referring now to FIG. 4, therein is shown a cross-sectional view of the integrated circuit packaging system 300 along line 4-4 of FIG. 3. The cross-sectional view depicts a second circuit device 418, such as an integrated circuit die, a thin or ultra thin integrated circuit die, a through silicon via (TSV) device, or a wiring substrate, mounted over a paddle 411, such as a die-attached paddle, a die-attach pad, or a carrier, with an adhesive 413, such as a conductive or thermal adhesive paste or film, in between. The second circuit device 418 can have a second circuit device active side 420 and a second circuit device non-active side 422. The second circuit device active side 420 can have active circuitry (not shown) fabricated thereon. Contact pads 424, such as bond pads, can be along the second circuit device active side 420.

The first circuit device 308 can be connected to the second circuit device 418. The first circuit device 308 can have a first circuit device active side 410 and a first circuit device non-active side 412. The first circuit device active side 410 can have active circuitry (not shown) fabricated thereon. Mounting pads 414, such as bond pads for connecting devices to the first circuit device 308, can be along the first circuit device active side 210. Interconnect pads 416, such as bond pads, can be along and adjacent to the periphery of the first circuit device active side 410.

The first circuit device 308 can be attached to the second circuit device 418 in an active side to active side configuration with the second circuit device active side 420 facing the first circuit device active side 410. The contact pads 424 along the second circuit device active side 420 can be vertically aligned with the mounting pads 414 along the first circuit device active side 410.

Device interconnects 426, such as solder balls, solder bumps, or conductive bumps, can connect the contact pads 424 and the mounting pads 414. The device interconnects 426 can provide redistribution through the first circuit device 308 to the second circuit device 418. The first circuit device 308 can be larger than the second circuit device 418 with the horizontal dimension of the first circuit device 308 greater than the horizontal dimension of the second circuit device 418. For example, the edges of the first circuit device 308 can extend beyond the edges of the second circuit device 418.

The external interconnects 306 can have an L-shape configurations with tips 428 integrally formed with bases 430. The tips 428 are the horizontal portion of the letter "L" and the bases 430 are the vertical portion of the letter "L." The bases 430 can have a first thickness 431. The combined thickness of the first circuit device 308 and the second circuit device 418 can be less than the first thickness 431. The paddle 411 can be adjacent to and between the bases 430 of the external interconnects 306.

The tips 428 of the L-shape configurations can extend inwardly directly towards each other. In addition, the tips 428 can be coplanar with each other. The tips 428 can have a second thickness 433.

The external interconnects 306 can have an external interconnect first side 432, an external interconnect second side 434, and an external interconnect vertical side 436. The external interconnect first side 432, the external interconnect second side 434, and the external interconnect vertical side 436 can be exposed to ambient.

Internal interconnects 438, such as bond wires, ribbon bond wires, can connect the tips 428 of the external interconnects 306 and the interconnect pads 416 of the first circuit device 308. The first circuit device 308 can be adjacent to and between the tips 428 of the external interconnects 306 at horizontally opposing sides of the first circuit device 308.

The encapsulation 302 can partially cover the external interconnects 306, the paddle 411 and the first circuit device 308. The encapsulation 302 can cover the internal interconnect 438 the device interconnects 426, the adhesive 413, and the second circuit device 418.

The encapsulation 302 can be of the first thickness 431, between the bases 430 and over the tips 428. The bases 430 of the external interconnects 306 can be exposed from an encapsulation first side 440 along the external interconnect first side 432. The external interconnect first side 432 can be coplanar with the encapsulation first side 440.

The tips 428 of the external interconnects 306 can be exposed from an encapsulation second side 442 along the external interconnect second side 434. The external interconnect second side 434 can be coplanar with the encapsulation second side 442.

A side of the paddle 411 facing away from the second circuit device non-active side 422 can be exposed to ambient from the encapsulation first side 440 and can be coplanar with the encapsulation first side 440 and the external interconnect first side 432. The paddle 411 may serve other functions, such as a heat sink, an electromagnetic interference (EMI) shield, or a coplanar rigidity structure for mitigating warpage.

The first circuit device non-active side 412 can be exposed from the encapsulation second side 442. The first circuit device non-active side 412 can be coplanar with the encapsulation second side 442 and the external interconnect second side 434. The first circuit device non-active side 412 can be exposed to ambient and may be used as a thermal dissipation surface.

Figure 5:
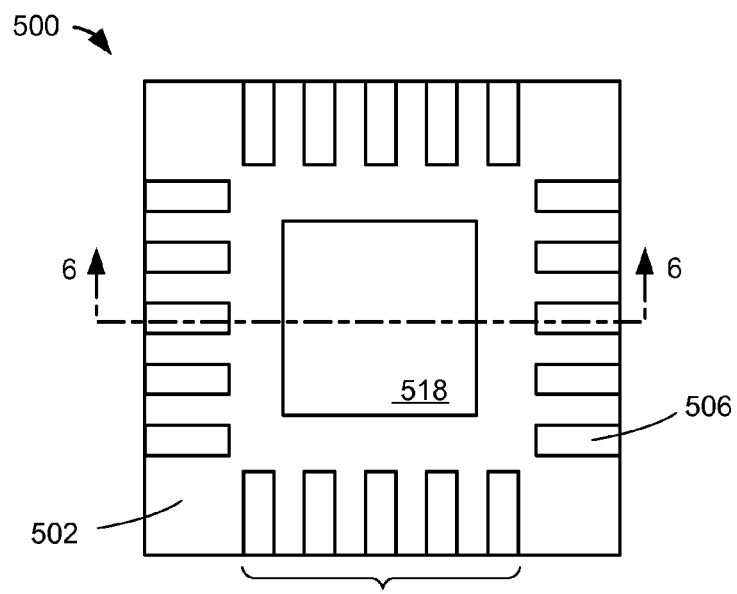
FIG. 5 is a top view of an integrated circuit packaging system in a third embodiment of the present invention.

Referring now to FIG. 5, therein is shown a top view of an integrated circuit packaging system 500 in a third embodiment of the present invention. The top view depicts an encapsulation 502, such as a cover including an epoxy molding compound. A second circuit device 518, such as an integrated circuit die, a thin or ultra thin integrated circuit die, a flip chip, a through silicon via (TSV) device, or a wiring substrate, can be exposed from the encapsulation 502. A row 504 of external interconnects 506, such as leads, can be exposed from the encapsulation 502. The row 504 of the external interconnects 506 can be along a side of the encapsulation 502. The external interconnects 506 can be made from a copper, nickel/palladium, or gold alloy.

For illustrative purposes, the integrated circuit packaging system 500 is shown with the row 504 of the external interconnects 506 along four sides of the encapsulation 502 although it is understood that the row 504 of the external interconnects 506 can have a different configuration. For example, the row 504 of the external interconnects 506 can be along one or more sides of the encapsulation 502.

Figure 6:
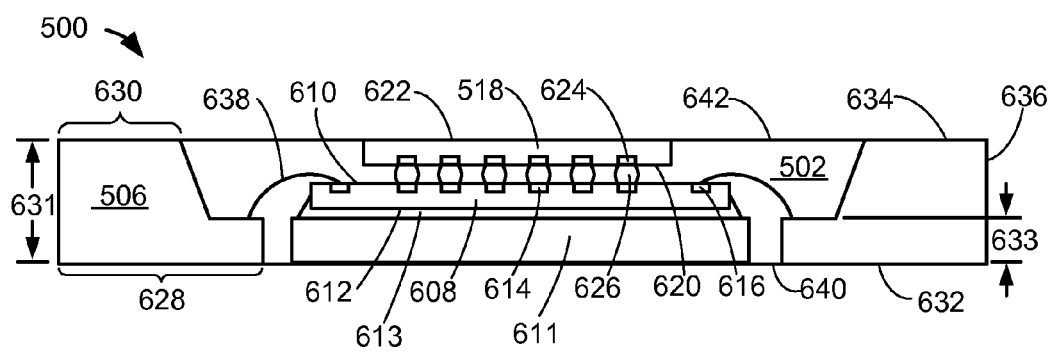
FIG. 6 is a cross-sectional view of the integrated circuit packaging system along line segment 6-6 of FIG. 5.

Referring now to FIG. 6, therein is shown a cross-sectional view of the integrated circuit packaging system 500 along line 6-6 of FIG. 5. The cross-sectional view depicts a first circuit device 608, such as an integrated circuit die, a thin or ultra thin integrated circuit die, a through silicon via (TSV) device, or a wiring substrate, mounted over a paddle 611, such as a die-attached paddle, a die-attach pad, or a carrier, with an adhesive 613, such as a conductive or thermal adhesive paste or film, in between. The first circuit device 608 can have a first circuit device active side 610 and a first circuit device non-active side 612. The first circuit device active side 610 can have active circuitry (not shown) fabricated thereon. Mounting pads 614, such as bond pads for connecting devices to the first circuit device 608, can be along the first circuit device active side 610. Interconnect pads 616, such as bond pads, can be along and adjacent to the periphery of the first circuit device active side 610.

The second circuit device 518 can be connected to the first circuit device 608. The second circuit device 518 can have a second circuit device active side 620 and a second circuit device non-active side 622. The second circuit device active side 620 can have active circuitry (not shown) fabricated thereon. Contact pads 624, such as bond pads, can be along the second circuit device active side 620.

The second circuit device 518 can be attached to the first circuit device 608 in an active side to active side configuration with the second circuit device active side 620 facing the first circuit device active side 610. The contact pads 624 along the second circuit device active side 620 can be vertically aligned with the mounting pads 614 along the first circuit device active side 610.

Device interconnects 626, such as solder balls, solder bumps, or conductive bumps, can connect the contact pads 624 and the mounting pads 614. The device interconnects 626 can provide redistribution through the first circuit device 608 to the second circuit device 518. The first circuit device 608 can be larger than the second circuit device 518 with the horizontal dimension of the first circuit device 608 greater than the horizontal dimension of the second circuit device 518. For example, the edges of the first circuit device 608 can extend beyond the edges of the second circuit device 518.

The external interconnects 506 can have an L-shape configurations with tips 628 integrally formed with bases 630. The tips 628 are the horizontal portion of the letter "L" and the bases 630 are the vertical portion of the letter "L." The bases 630 can have a first thickness 631.

The tips 628 of the L-shape configurations can extend inwardly directly toward each other. In addition, the tips 628 can be coplanar with each other. The tips 628 can have a second thickness 633.

The external interconnects 506 can have an external interconnect first side 632, an external interconnect second side 634, and an external interconnect vertical side 636. The external interconnect first side 632, the external interconnect second side 634, and the external interconnect vertical side 636 can be exposed to ambient.

Internal interconnects 638, such as bond wires, ribbon bond wires, can connect the tips 628 of the external interconnects 506 and the interconnect pads 616 of the first circuit device 608. The first circuit device 608 can be adjacent to and between the tips 628 of the external interconnects 506 at horizontally opposing sides of the first circuit device 608. The paddle 611 can be adjacent to and between the tips 628 of the external interconnects 506 at horizontally opposing sides of the paddle 611.

The encapsulation 502 can partially cover the external interconnects 506, the paddle 611 and the second circuit device 518. The encapsulation 502 can cover the internal interconnects 638 the device interconnects 626, the adhesive 613 and the first circuit device 608.

The encapsulation 502 can be of the first thickness 631, between the bases 630 and over the tips 628. The tips 628 of the external interconnects 506 can be exposed from an encapsulation first side 640 along the external interconnect first side 632. The external interconnect first side 632 can be coplanar with the encapsulation first side 640.

The bases 630 of the external interconnects 506 can be exposed from an encapsulation second side 642 along the external interconnect second side 634. The external interconnect second side 634 can be coplanar with the encapsulation second side 642.

A side of the paddle facing away from the first circuit device non-active side 612 can be exposed to ambient from the encapsulation first side 640 and can be coplanar with the encapsulation first side 640 and the external interconnect first side 632. The paddle 611 may serve other functions, such as a heat sink, an electromagnetic interference (EMI) shield, or a coplanar rigidity structure for mitigating warpage.

The second circuit device non-active side 622 can be exposed from the encapsulation second side 642. The second circuit device non-active side 622 can be coplanar with the encapsulation second side 642 and the external interconnect second side 634. The second circuit device non-active side 622 can be exposed to ambient and may be used as a thermal dissipation surface.

Figure 7:
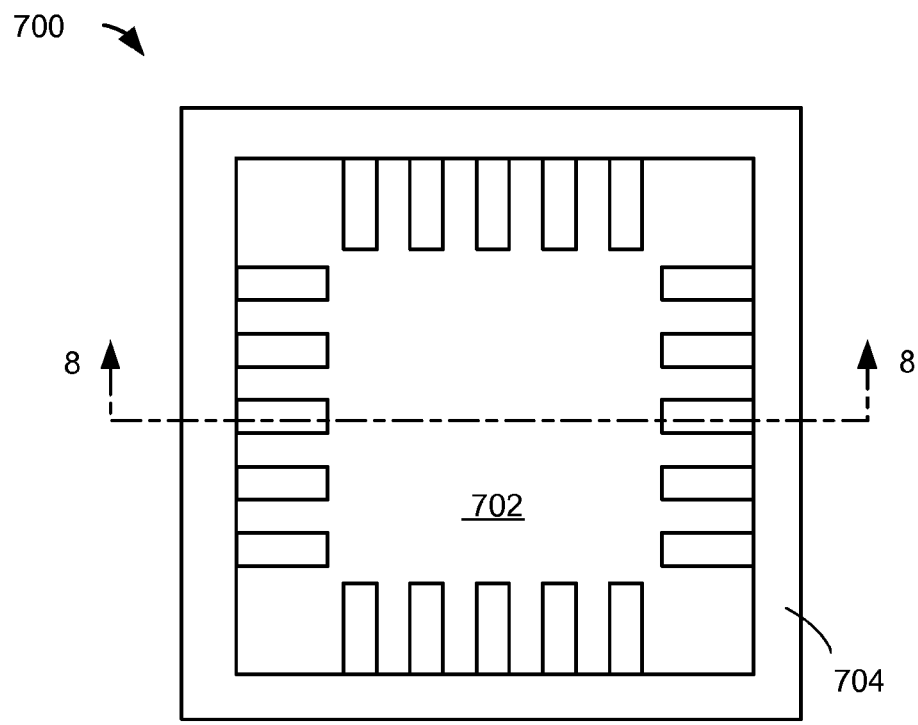
FIG. 7 is a top view of an integrated circuit package-on-package system in a fourth embodiment of the present invention.

Referring now to FIG. 7, therein is shown a top view of an integrated circuit package-on-package system 700 in a fourth embodiment of the present invention. The top view depicts a stackable integrated circuit package 702, mounted over a substrate 704, such as a printed circuit board.

Figure 8:
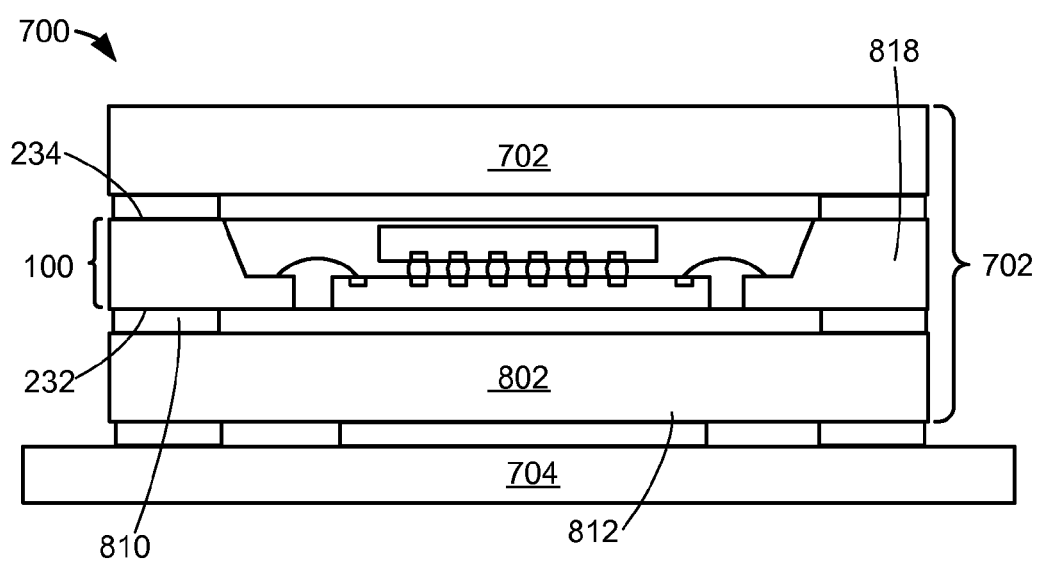
FIG. 8 is a cross-sectional view of the integrated circuit package-on-package system along line segment 8-8 of FIG. 7.

Referring now to FIG. 8, therein is shown a cross-sectional view of the integrated circuit package-on-package system along line segment 8-8 of FIG. 7. The cross-sectional view depicts a mountable integrated circuit package 802 mounted over the substrate 704. The mountable integrated circuit package 802 can represent the integrated circuit packaging system 100, the integrated circuit packaging system 300 of FIG. 3, or the integrated circuit packaging system 500 of FIG. 5.

The integrated circuit packaging system 100 can be mounted over the mountable integrated circuit package 802. The stackable integrated circuit package 702 can be mounted over the integrated circuit packaging system 100. The stackable integrated circuit package 702 can represents the integrated circuit packaging system 100, the integrated circuit packaging system 300, or the integrated circuit packaging system 500.

For illustrative purposes, the integrated circuit package-on-package system 700 is shown with the mountable integrated circuit package 802 stacked below the integrated circuit packaging system 100, although it is understood that the integrated circuit package-on-package system 700 can have a different configuration. For example, the mountable integrated circuit package 802 can be stacked below, the integrated circuit packaging system 300 of FIG. 3 or the integrated circuit packaging system 500 of FIG. 5.

For further illustrative purposes, the integrated circuit package-on-package system 700 is shown with the mountable integrated circuit package 802 mounted over the substrate 704, although it is understood that the integrated circuit package-on-package system 700 can have a different configuration. For example, the integrated circuit packaging system 100 can be mounted over the substrate 704.

The external interconnect first side 232 of the integrated circuit packaging system 100 can be attached to the mountable integrated circuit package 802 with a conductive material 810, such as a solder paste. The external interconnect second side 234 of the integrated circuit packaging system 100 can be attached to the stackable integrated circuit package 702 with the conductive material 810.

The mountable integrated circuit package 802 and the stackable integrated circuit package 702 may be tested to ensure KGD before the package-on-package assembly process. This ensures any bad device is sorted out such that the yield for the integrated circuit package-on-package system 700 is not impacted by bad device. The integrated circuit package-on-package system 700 may further undergo testing during and after assembly.

Figure 9:
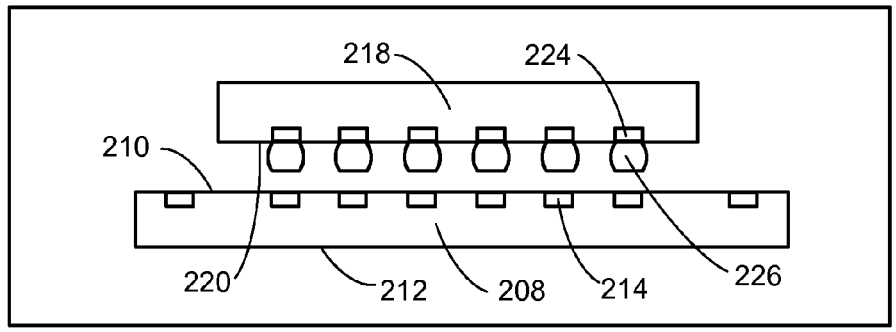
FIG. 9 is a cross-sectional view of a portion of the integrated circuit packaging system of FIG. 1 in an attachment phase.

Referring now to FIG. 9, therein is shown a cross-sectional view of a portion of the integrated circuit packaging system 100 of FIG. 1 in an attachment phase. The cross-sectional view depicts the first circuit device 208 having the first circuit device active side 210, the first circuit device non-active side 212 and the mounting pads 214.

The second circuit device 218 can be attached to the first circuit device 208 in an active side to active side configuration with the second circuit device active side 220 facing the first circuit device active side 210. The device interconnects 226 electrically connects the first circuit device 208 directly with the second circuit device 218 in the active side to active side configuration. The device interconnects 226 are directly between the second circuit device active side 220 and the first circuit device active side 210. The second circuit device 218 can be connected to the first circuit device 208 with the contact pads 224 vertically aligned with the mounting pads 214. The device interconnects 226 can connect the contact pads 224 with the mounting pads 214.

Figure 10:
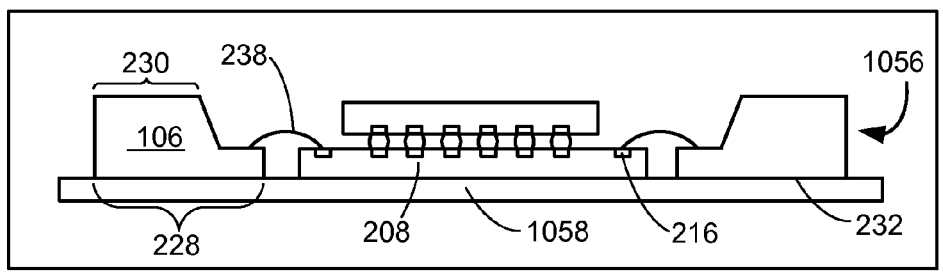
FIG. 10 is the structure of FIG. 9 in a tape-attach phase.

Referring now to FIG. 10, therein is shown the structure of FIG. 9 in a tape-attach phase. The cross-sectional view depicts a portion of a lead frame 1056 on a coverlay tape 1058. The lead frame 1056 includes the external interconnects 106. The external interconnects 106 can have an L-shape configurations with the tips 228 integrally formed with the bases 230.

The tips 228 of the L-shape configurations can extend towards the first circuit device 208. The tips 228 are the horizontal portion of the letter "L" and the bases 230 are the vertical portion of the letter "L." The external interconnect first side 232 can be on and facing the coverlay tape 1058. The bases 230 of the external interconnects 106 can point away from the coverlay tape 1058. The bases 230 can be formed to have a first thickness 231.

The tips 228 can extend inwardly directly toward each other. In addition, the tips 228 can be coplanar with each other. The tips 228 can be formed to have a second thickness 233.

The first circuit device 208 can be on the coverlay tape 1058 and adjacent to and between the tips 228 of the external interconnects 106 at horizontally opposing sides of the first circuit device 208. The internal interconnects 238 can connect the first circuit device 208 and the tips 228 of the external interconnects 106.

Figure 11:
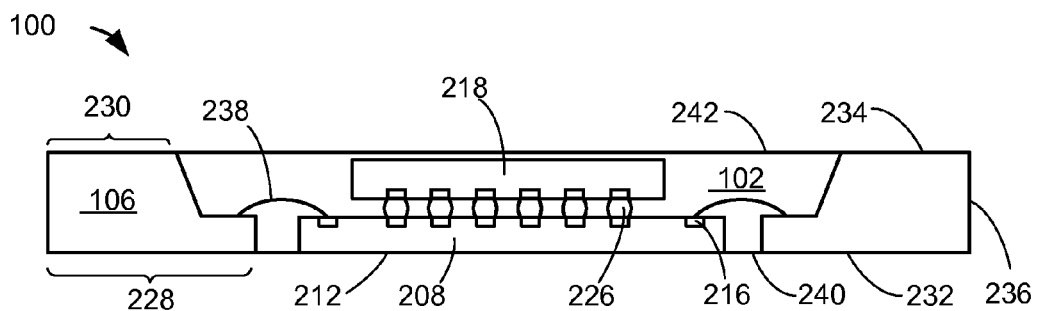
FIG. 11 is the structure of FIG. 10 in a forming phase of the integrated circuit packaging system.

Referring now to FIG. 11, therein is shown the structure of FIG. 10 in a forming phase of the integrated circuit packaging system 100. The encapsulation 102 can be formed to partially cover the external interconnects 106 and the first circuit device 208. The encapsulation 102 can cover the internal interconnects 238, the device interconnects 226, and the second circuit device 218. The encapsulation 102 can be of the first thickness 231 and formed between the bases 230 and over the tips 228.

The bases 230 of the external interconnects 106 can be exposed from the encapsulation second side 242 along the external interconnect second side 234. The external interconnect second side 234 can be coplanar with and exposed from the encapsulation second side 242.

The coverlay tape 1058 of FIG. 10 can be removed to expose the encapsulation first side 240, the external interconnect first side 232 and the first circuit device non-active side 212. The tips 228 of the external interconnects 106 can be exposed from the encapsulation first side 240 along the external interconnect first side 232. The external interconnect first side 232 can be coplanar with and exposed from the encapsulation first side 240.

The first circuit device non-active side 212 can be exposed from the encapsulation first side 240. The first circuit device non-active side 212 can be exposed to ambient and may be used as a thermal dissipation surface. The first circuit device non-active side 212 can be coplanar with the encapsulation first side 240 and the external interconnect first side 232.

The lead frame 1056 of FIG. 10 can be singulated to form the integrated circuit packaging system 100. Singulation of the lead frame 1056 can also form the external interconnect vertical side 236 of the external interconnects 106. The external interconnect first side 232, the external interconnect second side 234, and the external interconnect vertical side 236 can be exposed to ambient.

Figure 12:
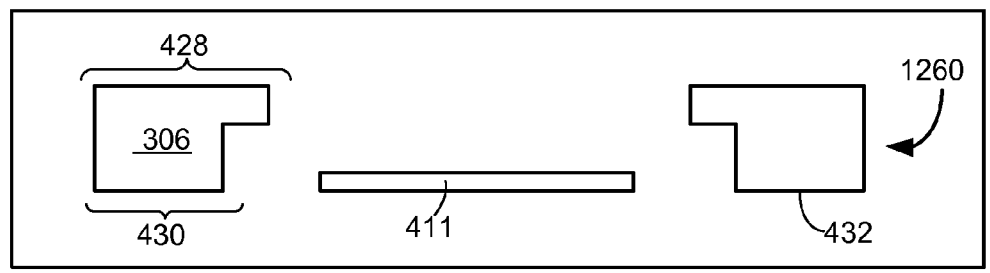
FIG. 12 is a cross-sectional view of a portion of the integrated circuit packaging system of FIG. 3 in a forming phase for a lead frame.

Referring now to FIG. 12, therein is shown a cross-sectional view of a portion of the integrated circuit packaging system 300 of FIG. 3 in a forming phase for a lead frame 1260. The lead frame 1260 includes the external interconnects 306 and the paddle 411. The external interconnects 306 can have an L-shape configurations with the tips 428 integrally formed with the bases 430. The tips 428 of the L-shape configurations can extend towards the paddle 411. The tips 428 are the horizontal portion of the letter "L" and the bases 430 are the vertical portion of the letter "L." The tips 438 for the external interconnects 306 can be coplanar with each other.

The lead frame 1260 can be formed with the bases 430 of the external interconnects 306 facing downward. The paddle 411 can be adjacent to and coplanar with the external interconnect first side 432.

Figure 13:
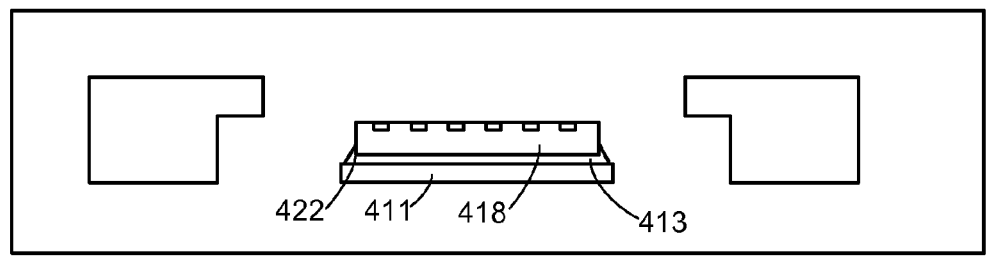
FIG. 13 is the structure of FIG. 12 in a mounting phase of the second circuit device.

Referring now to FIG. 13, therein is shown the structure of FIG. 12 in a mounting phase of the second circuit device 418. The second circuit device 418 can be mounted over the paddle 411 with the second circuit device non-active side 422 facing the paddle 411. The adhesive 413 can be between the second circuit device 418 and the paddle 411.

Figure 14:
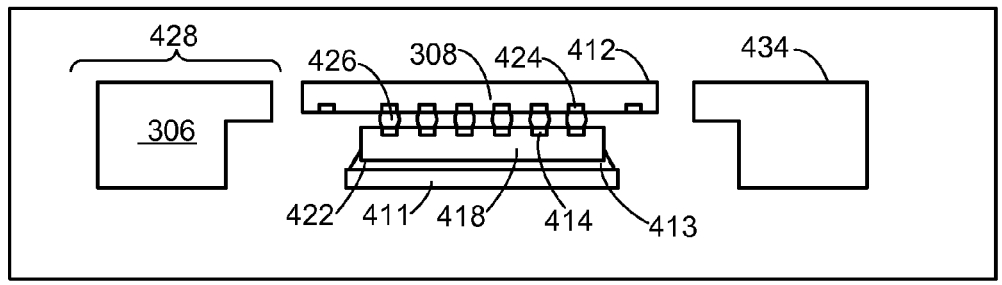
FIG. 14 is the structure of FIG. 13 in a connecting phase of the first circuit device.

Referring now to FIG. 14, therein is shown the structure of FIG. 13 in a connecting phase of the first circuit device 308. The first circuit device 308 can be attached to the second circuit device 418 in an active side to active side configuration. The first circuit device 308 can be connected to the second circuit device 418 with the contact pads 424 vertically aligned with the mounting pads 414.

The device interconnects 426 can connect the contact pads 424 and the mounting pads 414. The first circuit device 308 can be connected such that first circuit device 208 is adjacent to and between the tips 428 of the external interconnects 306 at horizontally opposing sides of the first circuit device 308 and the first circuit device non-active side 412 is substantially coplanar with the external interconnect second side 434.

The device interconnects 426 can be connected to the contact pads 424 and the mounting pads in a number of different ways. For example, the device interconnects 426 can be connected to the contact pads 424 and the mounting pads 414 by flipping the integrated circuit packaging system 300 such that the contact pads 424 and the mounting pads 414 are facing upwards.

Figure 15:
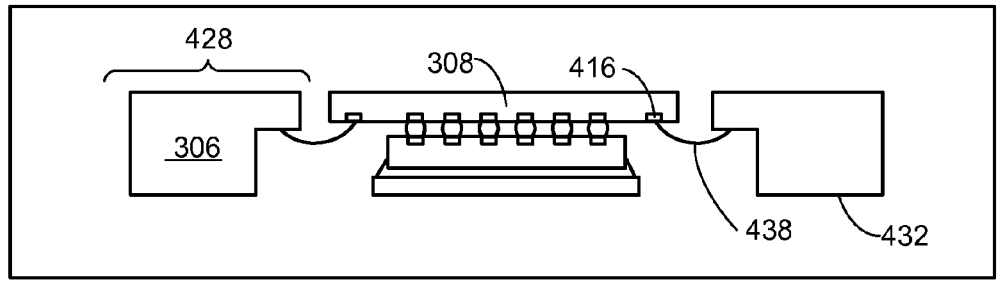
FIG. 15 is the structure of FIG. 14 in a connecting phase of the first circuit device and the external interconnects.

Referring now to FIG. 15, therein is shown the structure of FIG. 14 in a connecting phase of the first circuit device 308 and the external interconnects 306. The first circuit device 308 can be connected to the external interconnects 306 with the internal interconnects 438. The internal interconnects 438 can connect the interconnect pads 416 of the first circuit device 308 with the portion of the tips 428 of the external interconnects 306 that is facing away from the external interconnect first side 232.

Figure 16:
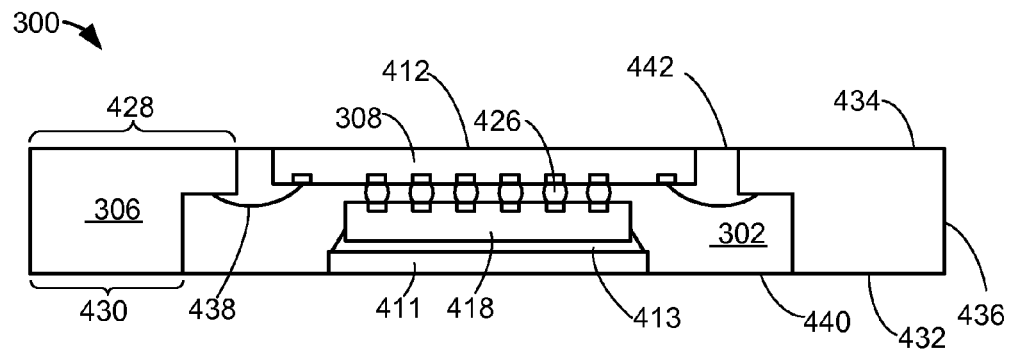
FIG. 16 is the structure of FIG. 15 in a forming phase of the integrated circuit packaging system.

Referring now to FIG. 16, therein is shown the structure of FIG. 15 in a forming phase of the integrated circuit packaging system 300. The encapsulation 302 can be formed around a portion of the external interconnects 306, the paddle 411, and the first circuit device 308. There are a number of ways to form the encapsulation 302. For example, the structure of FIG. 15 can be placed between planar mold chase (not shown) and can undergo transfer or injection molding.

The encapsulation 302 can cover the second circuit device 418, the adhesive 413, the device interconnects 426, and the internal interconnects 438. The bases 430 of the external interconnects 306 can be exposed from the encapsulation first side 440 along the external interconnect first side 432. The external interconnect first side 432 can be coplanar with the encapsulation first side 440.

The tips 428 of the external interconnects 306 can be exposed from the encapsulation second side 442 along the external interconnect second side 434. The external interconnect second side 434 can be coplanar with the encapsulation second side 442.

A side of the paddle 411 facing away from the second circuit device non-active side 422 can also be exposed to ambient from the encapsulation second side 442 and can be coplanar with the encapsulation second side 442 and the external interconnect second side 434.

The lead frame 1260 of FIG. 12 can be singulated to form the integrated circuit packaging system 300. Singulation of the lead frame 1260 can also form the external interconnect vertical side 436 of the external interconnects 306. The external interconnect vertical side 436 can be exposed to ambient.

Figure 17:
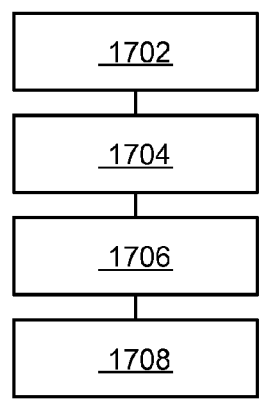
FIG. 17 is a flow chart of a method of manufacture of an integrated circuit packaging system in a further embodiment of the present invention.

Referring now to FIG. 17, therein is shown a flow chart of a method 1700 of manufacture of an integrated circuit packaging system 100 in a further embodiment of the present invention. The method 1700 includes forming external interconnects having bases of a first thickness and tips of a second thickness extending inwardly directly toward each other in a block 1702; connecting a first circuit device between the tips in a block 1704; attaching a second circuit device to the first circuit device with a combined thickness of the first circuit device and the second circuit device less than the first thickness in a block 1706; and forming an encapsulation of the first thickness between the bases and over the tips in a block 1708.

Another important aspect of the present invention is that it valuably supports and services the historical trend of reducing costs, simplifying systems, and increasing performance.

These and other valuable aspects of the present invention consequently further the state of the technology to at least the next level.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method of manufacture of an integrated circuit packaging system comprising:
    forming external interconnects having bases of a first thickness and tips of a second thickness extending inwardly directly toward each other, each of the tips include a bottom surface;
    connecting a first circuit device between the tips, the first circuit device having a first circuit device active side with a mounting pad therein and having a first circuit device non-active side, the first circuit device non-active side is coplanar with the bottom surface and another of the bottom surface of the tips;
    attaching a second circuit device over the first circuit device, the second circuit device having a second circuit device active side with a contact pad therein and a device interconnect, the device interconnect directly connected to the contact pad and the mounting pad with a combined thickness of the first circuit device and the second circuit device less than the first thickness; and
    forming an encapsulation of the first thickness between the bases and over the tips.

2. The method as claimed in claim 1 further comprising:
    forming a paddle adjacent to and between the bases of the external interconnects;
    mounting the second circuit device over the paddle; and
    wherein forming the encapsulation includes:
        forming the encapsulation with the paddle exposed.

3. The method as claimed in claim 1 further comprising:
    forming a paddle adjacent to and between the tips of the external interconnects;
    mounting the first circuit device over the paddle; and
    wherein forming the encapsulation includes:
        forming the encapsulation with the paddle exposed.

4. The method as claimed in claim 1 further comprising forming the first circuit device having a horizontal dimension greater than a horizontal dimension of the second circuit device.

5. The method as claimed in claim 1 wherein:
    forming the external interconnects includes forming the external interconnects having an external interconnect first side, an external interconnect second side, and an external interconnect vertical side; and forming the encapsulation includes forming the encapsulation with the external interconnect first side, the external interconnect second side, and the external interconnect vertical side exposed.

6. A method of manufacture of an integrated circuit packaging system comprising:
forming external interconnects each having an external interconnect first side, an external interconnect second side, an external interconnect vertical side, bases of a first thickness, and tips of a second thickness extending inwardly directly toward each other;
connecting a first circuit device between the tips with the first circuit device having a first circuit device active side with a mounting pad therein and having a first circuit device non-active side, the first circuit device non-active side is coplanar with the external interconnect first side of each of the tips;
attaching a second circuit device over the first circuit device, the second circuit device having a second circuit device active side with a contact pad therein and a device interconnect, the device interconnect directly connected to the contact pad and the mounting pad with a combined thickness of the first circuit device and the second circuit device less than the first thickness; and
forming an encapsulation of the first thickness between the bases and over the tips.

7. The method as claimed in claim 6 further comprising:
forming a paddle adjacent to and between the bases of the external interconnects;
mounting the second circuit device over the paddle; and
wherein forming the encapsulation includes:
forming the encapsulation first side coplanar with and exposing the paddle; and
forming the encapsulation second side coplanar with and exposing the first circuit device non-active side.

8. The method as claimed in claim 6 further comprising:
forming a paddle adjacent to and between the tips of the external interconnects;
mounting the first circuit device over the paddle; and
wherein forming the encapsulation includes:
forming the encapsulation first side coplanar with and exposing the paddle; and
forming the encapsulation second side coplanar with and exposing the second circuit device.

9. The method as claimed in claim 6 wherein forming the encapsulation includes:
forming the encapsulation first side coplanar with the external interconnect first side; and
forming the encapsulation second side coplanar with the external interconnect second side.

10. The method as claimed in claim 6 wherein attaching the second circuit device includes connecting a flip chip.

11. An integrated circuit packaging system comprising:
external interconnects having bases of a first thickness and tips of a second thickness extending inwardly directly toward each other, each of the tips include a bottom surface;
a first circuit device connected between the tips, the first circuit device having a first circuit device active side with a mounting pad therein and having a first circuit device non-active side, the first circuit device non-active side is coplanar with the bottom surface and another of the bottom surface of the tips;
a device interconnect directly connected to the mounting pad;
a second circuit device over the first circuit device, the second circuit device having a second circuit device active side with a contact pad therein and a device interconnect, the device interconnect directly connected to the contact pad and the mounting pad with a combined thickness of the first circuit device and the second circuit device less than the first thickness; and
an encapsulation of the first thickness between the bases and over the tips.

12. The system as claimed in claim 11 further comprising:
a paddle adjacent to and between the bases of the external interconnects and exposed from the encapsulation; and
wherein the second circuit device is mounted over the paddle.

13. The system as claimed in claim 11 further comprising:
a paddle adjacent to and between the tips of the external interconnects and exposed from the encapsulation; and
wherein the first circuit device is mounted over the paddle.

14. The system as claimed in claim 11 further comprising the first circuit device having a horizontal dimension greater than a horizontal dimension of the second circuit device.

15. The system as claimed in claim 11 wherein the external interconnects includes an external interconnect first side, an external interconnect second side, and an external interconnect vertical side with the external interconnect first side, the external interconnect second side, and the external interconnect vertical side exposed from the encapsulation.

16. The system as claimed in claim 11 wherein:
the external interconnects includes an external interconnect first side, an external interconnect second side, and an external interconnect vertical side;
the second circuit device includes a second circuit device active side and a second circuit device non-active side; and
the encapsulation includes an encapsulation first side and an encapsulation second side.

17. The system as claimed in claim 16 further comprising:
a paddle adjacent to and between the bases of the external interconnects and exposed from the encapsulation first side; and
wherein:
the second circuit device is mounted over the paddle;
the encapsulation having the encapsulation second side is coplanar with and exposing the first circuit device non-active side.

18. The system as claimed in claim 16 further comprising:
a paddle adjacent to and between the tips of the external interconnects and exposed from the encapsulation first side; and
wherein:
the first circuit device is mounted over the paddle; and
the second circuit device is exposed from and coplanar with the encapsulation second side.

19. The system as claimed in claim 16 wherein the encapsulation includes:
the encapsulation first side coplanar with the external interconnect first side; and
the encapsulation second side coplanar with the external interconnect second side.

20. The system as claimed in claim 16 wherein the second circuit device includes a flip chip.

* * * * *